(12) United States Patent
Knöll

(10) Patent No.: US 6,531,263 B2
(45) Date of Patent: Mar. 11, 2003

(54) PHOTOPOLYMERIZABLE FLEXOGRAPHIC PRINTING ELEMENTS COMPRISING SIS/SBS MIXTURES AS BINDER FOR THE PRODUCTION OF FLEXOGRAPHIC PRINTING PLATES

(75) Inventor: Rolf Knöll, Weinheim (DE)

(73) Assignee: BASF Drucksysteme GmbH, Stuttgart (DE)

(*) Notice: Subject to any disclaimer, the term of this patent is extended or adjusted under 35 U.S.C. 154(b) by 0 days.

(21) Appl. No.: 09/847,302

(22) Filed: May 3, 2001

(65) Prior Publication Data
US 2002/0001775 A1 Jan. 3, 2002

(30) Foreign Application Priority Data

May 3, 2000 (DE) .............................................. 10021196

(51) Int. Cl.⁷ ......................... G03F 7/028; G03F 7/038; B41N 1/12
(52) U.S. Cl. ............................ 430/287.1; 430/285.1; 430/286.1; 430/283.1
(58) Field of Search .................. 430/286.1, 287.1, 430/285.1, 283.1

(56) References Cited

U.S. PATENT DOCUMENTS

| 4,323,636 A | 4/1982 | Chen .................. 430/271.1 |
| 5,049,478 A | 9/1991 | Koch et al. .......... 430/270.1 |
| 5,247,014 A * | 9/1993 | Erickson ............... 525/92 |
| 5,496,684 A * | 3/1996 | Farber et al. ......... 430/306 |
| 5,948,594 A * | 9/1999 | Dudek et al. ........ 430/273.1 |
| 6,037,102 A | 3/2000 | Loerzer et al. ....... 430/306 |

FOREIGN PATENT DOCUMENTS

| DE | 2 215 090 | 10/1972 |
| EP | 084 851 | 8/1983 |
| EP | 362 641 | 4/1990 |
| EP | 696 761 | 2/1996 |
| EP | 654 150 | 3/1997 |
| EP | 767 407 | 4/1997 |
| EP | 992 849 | 4/2000 |
| GB | 1 366 769 | 9/1974 |

OTHER PUBLICATIONS

Plastics, General Survey (http://www.mrw.interscience . . . &entery+33449&resultID+51055'&resultNr×16), Ullmann's Encyclopedia of Industrial Chemistry, copyright 2002, John Wiley & Sons, Inc, VCH Verlag GmbH, Weinheim, Germany, 7 pages from internet site.*

* cited by examiner

Primary Examiner—Cynthia Hamilton
(74) Attorney, Agent, or Firm—Keil & Weinkauf

(57) ABSTRACT

A photopolymerizable composition which comprises a mixture of thermoplastic-elastomeric SIS and SBS block copolymers as binder, ethylenically unsaturated monomers, plasticizer and photoinitiator. Photopolymerizable flexographic printing element whose photopolymerizable layer comprises this composition. Use of photopolymerizable flexographic printing elements of this type for the production of flexographic printing plates.

7 Claims, No Drawings

PHOTOPOLYMERIZABLE FLEXOGRAPHIC PRINTING ELEMENTS COMPRISING SIS/SBS MIXTURES AS BINDER FOR THE PRODUCTION OF FLEXOGRAPHIC PRINTING PLATES

The present invention relates to a photopolymerizable composition which comprises a mixture of thermoplastic-elastomeric SIS and SBS block copolymers as binder, ethylenically unsaturated monomers, plasticizer and photoinitiator. It furthermore relates to photopolymerizable flexographic printing elements whose photopolymerizable layer comprises said photopolymerizable composition, and to the use of photopolymerizable flexographic printing elements of this type for the production of flexographic printing plates.

Thermoplastic-elastomeric block copolymers have been used for some time for the production of photopolymerizable flexographic printing elements. Thus, for example, DE 22 15 090 and U.S. Pat. No. 4,323,636 disclose photosensitive compositions comprising binder, ethylenically unsaturated monomers and photoinitiator in which the binder employed is either polystyrene-polybutadiene-polystyrene block copolymers (SBS) or polystyrene-polyisoprene-polystyrene block copolymers (SIS). Block copolymers of this type can advantageously be processed by melt extrusion, thus avoiding complex casting processes. Furthermore, they are inexpensive and readily commercially available. Although other (co)polymers have frequently also been proposed as binder, virtually all commercially available photopolymerizable flexographic printing elements that can be developed in organic media nowadays comprise thermoplastic-elastomeric block copolymers as binder.

For the production of commercially available photopolymerizable flexographic printing elements, hitherto only block copolymers either of the SBS type or of the SIS type have been employed. The SIS and SBS block copolymers which can be employed for the production of photopolymerizable flexographic printing elements are generally not compatible with one another and tend to separate. The photopolymerizable mixtures become cloudy owing to separation processes of this type and are unsuitable for the production of high-quality flexographic printing plates.

Flexographic printing plates based on SIS block copolymers or SBS block copolymers each have very characteristic advantages and disadvantages. SIS rubbers are softer and more plastic than SBS rubbers. They are therefore very particularly suitable for the production of relatively soft flexographic printing plates.

However, flexographic printing plates based on SIS rubbers tend to form cracks on exposure to ozone. For this reason, ozone protection waxes, such as, for example, selected paraffins or microwaxes, are therefore usually added to the formulations. Ozone protection waxes of this type form a nonpolar protective film on the surface of the flexographic printing plate, which can have a disadvantageous effect on ink transfer, in particular in the case of printing with water-based printing inks. Furthermore, flexographic printing plates based on SIS rubbers usually have higher surface tack and greater abrasion that those based on SBS.

SBS rubbers can be employed without the addition of ozone protection waxes. Flexographic printing plates based on SBS rubbers therefore have very good ink transfer, especially with water-based printing inks. The surface of flexographic printing plates based on SBS rubbers is less tacky and has greater abrasion resistance, which is very advantageously evident in particular in the case of printing on rough stock. However, printing plates comprising SBS rubbers have the disadvantage of greater hardness. In order to obtain soft flexographic printing plates, larger amounts of plasticizer are employed than in the case of SIS-based plates. However, the amount of plasticizer in the formulation naturally cannot be increased as desired without adversely affecting other properties. Also disadvantageous is the tendency of SBS printing plates toward anisotropy. This is taken to mean that direction-dependent mechanical, optical and printing properties are obtained during conventional production by melt extrusion and calendering. Since printing plates are not always clamped to the printing cylinder in the same orientation, adverse effects occur, in particular in the case of multicolor printing. Excessively high anisotropy is totally intolerable.

It would be desirable to have available a flexographic printing plate having the advantages of SBS rubbers without having to accept the disadvantages of the excessive hardness and anisotropy. It is therefore an object of the present invention to provide photopolymerizable flexographic printing elements for the production of flexographic printing plates of this type.

We have found, surprisingly, that this object can be achieved by using certain SBS rubbers in a mixture with SIS rubbers. This was all the more surprising as SIS and SBS rubbers are usually incompatible with one another.

Accordingly, the present invention provides photopolymerizable compositions which comprise a mixture of certain thermoplastic-elastomeric SIS and SBS block copolymers as binder, ethylenically unsaturated monomers, plasticizer and photoinitiator. The present invention furthermore provides photopolymerizable flexographic printing elements whose photopolymerizable layer comprises this composition, and the use of photopolymerizable flexographic printing elements of this type for the production of flexographic printing plates.

The SIS component employed is a conventional thermoplastic-elastomeric SIS block copolymer which is suitable for the production of photopolymerizable flexographic printing elements. The polystyrene content of such polymers is usually less than 40% by weight. Preference is given to block copolymers having a polystyrene content of from 10 to 35% by weight, particularly preferably block copolymers having a polystyrene content of from 10 to 20% by weight. The apparent molecular weight of the SIS block copolymers is usually from 80,000 to 300,000, preferably from 100,000 to 250,000. The term "apparent molecular weight" as used in the present specification is taken to mean the mean molecular weight $M_w$ determined with the aid of gel permeation chromatography (GPC) using polystyrene standards. The SIS block copolymers can either be linear block copolymers or radial block copolymers. They are usually three-block copolymers of the A-B-A type, but can also be two-block copolymers of the A-B type or those comprising a plurality of alternating elastomeric and thermoplastic blocks, for example A-B-A-B-A. It is also possible to employ mixtures of two or more different SIS block copolymers. Commercially available SIS block copolymers often have an SI two-block content. The SI two-block content is preferably from 0 to 40% by weight, particularly preferably from 10 to 30% by weight.

Preferably, the SIS block copolymers employed are linear block copolymers. In the photopolymerizable composition according to the invention, the SIS block copolymer is employed in the form of a mixture with one or more thermoplastic-elastomeric SBS block copolymers which are compatible with the SIS block copolymer. For the purposes of this invention, the term compatibility is taken to mean that the SBS and SIS block copolymers, together with the other components of the photopolymerizable mixture, can be converted into a clear, non-hazy mixture which does not scatter actinic light. Haziness, streaks or the like in the photopolymerizable layer have an adverse effect on the photopolymerization process, which means that no flexographic printing plates at all or at least only those of poor quality are obtained.

The SBS block copolymers can be linear three-block copolymers, two-block copolymers, polymers having a plurality of elastomeric and thermoplastic blocks, radial or quasi-radial block copolymers or mixtures thereof. The polystyrene content of the SBS block copolymers is from 5 to 25% by weight. At higher polystyrene contents, transparent mixtures are no longer obtained with the SIS block copolymers described above. The polystyrene content of the SBS block copolymer is preferably from 10 to 25% by weight, very particularly preferably from 15 to 20% by weight. The apparent molecular weight of the SBS block copolymers is usually from 50,000 to 300,000. Preference is given to SBS block copolymers having an apparent molecular weight of from 100,000 to 300,000, particular preference being given to SBS block copolymers having an apparent molecular weight of from 200,000 to 250,000. The polystyrene blocks have an apparent molecular weight of from 5000 to 50,000. The apparent molecular weight of the polystyrene blocks is preferably from 7000 to 35,000, particularly preferably from 9000 to 17,000. The apparent molecular weight of the polystyrene blocks is advantageously selected in such a way that it corresponds approximately to that of the polystyrene blocks of the SIS block copolymers described above. The butadiene units in the polybutadiene blocks may either be 1,4- or alternatively 1,2-linked. The vinyl bond content of the SBS block copolymers according to the invention is from 5 to 70% by weight, preferably in the range from 35 to 65% by weight, particularly preferably in the range from 50 to 60% by weight. Suitable SBS block copolymers are disclosed, for example, in EP-A 696 761.

Preferably, the SBS block copolymers employed are radial or branched block copolymers of the general formula $(SB)_x(B)_yZ$, where S and B stand in known manner for styrene or butadiene blocks and Z is a polyfunctional coupling agent linking several blocks to each other. (SB) units are usually linked to the coupling agent Z via the butadiene block. X in the formula is an integer from 1 to 20. Suitable radial SBS block copolymers are symmetrical radial block copolymers in which y=0, for example polymers of the formula $(SB)_4Z$ or $(SB)_zZ$. However, radial block copolymers having both (SB) and (B) arms are preferred. Particulary preferred are polymers of the general formula $(SB)_2(B)_2Z$. Radial block copolymers are disclosed for example in EP-A 696,761, and are commercially available.

The SBS/SIS block copolymer weight ratio is from 70/30 to 10/90. If the ratio of the block copolymers is greater than 70/30, excessively hard and brittle flexographic printing plates are obtained which may break on flexing. If the ratio of the block copolymers is less than 10/90, the plate surface is tacky, and ozone protection wax must continue to be used. The SBS/SIS ratio is preferably from 60/40 to 40/60.

The compositions according to the invention furthermore, in a known manner, comprise polymerizable compounds or monomers. The monomers should be compatible with the binders and have at least one polymerizable, ethylenically unsaturated double bond. Suitable monomers generally have a boiling point of above 100° C. at atmospheric pressure and a molecular weight of up to 3000 g/mol, preferably up to 2000 g/mol. Esters or amides of acrylic acid or methacrylic acid with monofunctional or polyfunctional alcohols, amines, aminoalcohols or hydroxyethers and -esters, styrene or substituted styrenes, esters of fumaric or maleic acid or allyl compounds have proven particularly advantageous. Examples of suitable monomers are butyl acrylate, 2-ethylhexyl acrylate, lauryl acrylate, 1,4-butanediol diacrylate, 1,6-hexanediol diacrylate, 1,6-hexanediol dimethacrylate, 1,9-nonanediol diacrylate, trimethylolpropane triacrylate, dioctyl fumarate and N-dodecylmaleimide.

Suitable initiators for the photopolymerization are, inter alia, benzoin or benzoin derivatives, such as α-methylbenzoin or benzoin ethers, benzil derivatives, such as benzil ketals, acylarylphosphine oxides, acylarylphosphinic acid esters, polynuclear quinones or benzophenones.

The photopolymerizable compositions according to the invention generally comprise from 50 to 90% by weight of the binder mixture of SIS and SBS block copolymers, based on the sum of all constituents. From 60 to 85% by weight of the binder are preferably employed. The amount of the polymerizable monomers is in the range from 4.9 to 30% by weight, preferably from 4.9 to 20% by weight. The amount of photoinitiator is from 0.1 to 5% by weight.

In addition, the photopolymerizable mixtures comprise at least one plasticizer. It is also possible to employ mixtures of different plasticizers. In addition to their actual function for establishing a desired hardness range, the plasticizers also advantageously contribute to optimum compatibility of the SIS and SBS rubbers. Examples of suitable plasticizers are modified or unmodified natural oils and resins, paraffinic mineral oils, alkyl, alkenyl, arylalkyl or arylalkenyl esters of acids, such as alkanoic acids or arylcarboxylic acids. Preference is given to synthetic oligomers or resins, such as oligostyrene, oligomeric styrene-butadiene copolymers, oligomeric α-methylstyrene-p-methylstyrene copolymers, liquid oligobutadienes, liquid oligoisoprenes or liquid oligomeric acrylonitrile-butadiene copolymers. Oligomers of this type typically have a molecular weight of from 500 to 5000 g/mol.

Very particularly preferred plasticizers are polybutadiene oils. The amount of plasticizer is generally from 5 to 40% by weight, based on the sum of all constituents of the photopolymerizable mixture. The amount is preferably from 8 to 35% by weight, particularly preferably from 10 to 30% by weight.

The photopolymerizable mixtures may furthermore comprise conventional auxiliaries, in particular inhibitors for thermally initiated polymerization, dyes, pigments, photochromic additives, antioxidants or extrusion aids. Their amount is generally less than 10% by weight, based on the sum of all constituents of the photopolymerizable composition.

The photopolymerizable composition according to the invention can be employed for the production of photopolymerizable flexographic printing elements. Photopolymerizable flexographic printing elements of this type comprise a photopolymerizable, relief-forming layer applied to a dimensionally stable support, where appropriate with an adhesion layer.

The photopolymerizable flexographic printing elements according to the invention are on the one hand plates. Suitable dimensionally stable supports for this purpose are, in particular, dimensionally stable support films, for example polyester films, in particular polyethylene terephthalate films or polyethylene naphthalate films. These support films generally have a thickness of from 50 to 500 μm, preferably from 75 to 400 μm, for example about 125 μm. The layer support may be underlaid with a soft, elastic underlayer. However, they can also be flexosleeves, in which the supports employed are conical or cylindrical tubes made of metals or plastics.

The thickness of the photopolymerizable relief-forming layer depends primarily on the supposed use of the printing plates. Thus, the thickness generally varies from 0.1 to 7 mm, preferably from 0.7 to 6.5 mm. It is selected by the person skilled in the art in accordance with the requirements of the application desired in each case.

The photopolymerizable layer can be produced by dissolving the binder and the further constituents of the layer in a suitable solvent or solvent mixture in a known manner, casting the solution onto the support, and evaporating the solvent. The photopolymerizable flexographic printing element is preferably produced in a known manner by melt extrusion at elevated temperatures and calendering, in which case the particular advantages of the invention come into effect: while anisotropic products are usually obtained in the course of this process with conventional SBS rubber-containing formulations, products with no or virtually no anisotropy are obtained in the case of the use according to the invention of SIS/SBS mixtures.

The photopolymerizable layer can also be built up from a plurality of part-layers. These part-layers may be of the same, approximately the same or different material composition. The production of the layer built up from part-layers can be carried out, for example, by the method indicated in EP-A 0 362 641.

The photopolymerizable flexographic printing element is usually protected against mechanical damage in a known manner by means of a protective film, which is located on the photopolymerizable layer. If desired, it can also comprise further layers, depending on the intended application.

An example of a further layer is a cover layer (also known as release layer) between the photopolymerizable layer and the protective film. This cover layer frequently consists of suitable polyamides and is soluble in the developer for the photopolymerizable layer, simplifying the peeling-off of the protective film before use of the printing plate and the positioning of the photographic negative for imaging.

A further example is a relatively thin, likewise photopolymerizable upper layer on the photopolymerizable layer (also known as top layer). A top layer of this type is disclosed, for example, in EP-A 084 851. This two-layer structure has the advantage that the properties of the surface of the printing plate, such as, for example, ink transfer, can be modified without the flexotypical properties of the printing plate, such as, for example, hardness or elasticity, being affected. The surface properties and layer properties can thus be modified independently of one another in order to achieve an optimum print result.

Mention may furthermore be made of an IR-ablative layer. This can be located on the photopolymerizable layer or—if present—on the top layer. Such layers usually comprise a binder and carbon black. They serve for direct, digital imaging of the photopolymerizable flexographic printing element by means of IR laser. Examples of such layers are given in EP-A 767 407 or in EP-A 654 150.

The photopolymerizable flexographic printing elements according to the invention can be employed in a manner known per se for the production of flexographic printing plates. The production of the flexographic printing plates can be carried out either by the classical procedure involving pre-exposure, peeling-off of any protective film present, laying-on of a photographic negative, imagewise exposure with actinic light, development, drying and, if desired, aftertreatment. The production can alternatively be carried out via digital imaging. To this end, a photopolymerizable flexographic printing element according to the invention which has an IR-ablative layer is employed. The production of the flexographic printing plates comprises the steps of pre-exposure, peeling-off of any protective film present, imagewise writing of the IR-ablative layer, imagewise exposure to actinic light, development, drying and, if desired, aftertreatment. Further details on both processes are known to the person skilled in the art and are disclosed, for example, in EP-A 992 849.

The flexographic printing plates obtained using the photopolymerizable flexographic printing elements according to the invention have the typical advantages of flexographic printing plates comprising SBS rubber, namely high ozone cracking resistance and high abrasion resistance. They can be employed without ozone protection wax. In addition, they have an advantageously low hardness for the same amount of plasticizer and in addition have no anisotropy.

The examples below are intended to explain the invention in greater detail without the scope of the invention being restricted thereby.

The measurement values described were determined as follows:

| Measurement value | Measurement procedure |
|---|---|
| Anisotropy factor | A dumbbell-shaped test specimen is stamped out of a flexographic printing plate which has been exposed over the entire surface to actinic light for at least 20 minutes. This test specimen is clamped into a tensile testing machine (Zwick). A tensile stress/elongation measurement is carried out. The anisotropy factor is given by the quotient of the longitudinal tear force to the transverse tear force at an elongation of 125%. Longitudinal and transverse refer to the extrusion direction. Flexographic printing plates are referred to as anisotropic if the anisotropy factor is greater than 1.2. |
| Raw layer plasticity | The raw layer plasticity is determined on photopolymerizable flexographic printing elements after removal of the protective film. In this test, a defined measurement ram carrying a defined weight is pressed into the raw layer for a certain time. The difference in layer thickness before loading and after loading for 10 minutes with the measurement ram is measured (result in percent, opposite sign). |
| Shore A hardness | The cliché hardness of photopolymeric flexographic printing plates is determined with the aid of a Shore A hardness measuring instrument in accordance with DIN 53505. The hardness of the sample, indicated in Shore A, is determined via the penetration depth of a defined measurement ram into the sample to be measured. Deviating from the DIN 53505 standard, however, layers with a thickness of 6 mm are not used. The cliché hardness is measured directly on the cliché. |

In the examples and comparative examples, the following general experimental procedure was followed:

A) Preparation of the photopolymerizable mixture:

A mixture of binders, ethylenically unsaturated monomers, photoinitiator, plasticizer and dye was extruded in a twin-screw extruder (Werner & Pfleiderer ZSK 53) with a throughput of 30 kg/h at a material temperature of from 160 to 170° C. and discharged through a slot die. The melt discharged from the die was introduced into the nip of a two-roll calender. The two rolls were heated to 80° C.

A polyethylene terephthalate film (Mylar®) with a thickness of 125 µm which had been coated with an adhesive coating was fed in over the upper calender roll, and a polyethylene terephthalate film (Mylar®) with a thickness of 125 µm which had been coated with a release layer consisting of polyamide was fed in over the lower calender roll.

B) Production of the print cliché

After a storage time of one week, the crude plates were converted into clichés. The following processing steps were carried out:

a Full-area exposure to UV light on the reverse (FIII exposure unit, BASF, 35 s), b Peeling-off of the protective film, c Laying-on of a nyloflex® FAR II test film (BASF), d Principal exposure under the vacuum film (FIII exposure unit, BASF, 4–18 min in 2 minute steps)

e Washing-out of the plate (Combi FII through-flow washer, BASF, washing rate 150 mm/min, washing agent: nylosolv® II, BASF, 30° C., relief depth 1000 μm)

f Drying for 3 hours at 65° C.

g Secondary exposure (UVA, FIII exposure unit, BASF, 15 minutes)

h Subsequent treatment with UVC light (FIII secondary treatment unit, BASF, 15 minutes)

The test cliché was evaluated. The exposure time at which the positive test elements (free-standing dot: 200 μm, grid: 55 μm, 2% density screen field (60 L/cm)) were correctly formed on the cliché was assessed. The time at which all positive elements have formed correctly is known as the lower exposure limit (LEL), i.e. the minimum exposure duration for correct imaging.

In addition, the negative elements, i.e. the 400 μm negative dot and the 200 μm trench, were also assessed. If the depth is less than 70 μm in the negative dot or less than 500 μm in the trench, correct ink transfer is no longer ensured. The time at which at least one of the two negative elements drops below these limits is known as the upper exposure limit (UEL). The difference between the UEL and the LEL gives the so-called exposure latitude (EL). For use of the flexographic printing plate in accordance with practical requirements, the exposure latitude must be positive. A negative exposure latitude means that the fine negative elements have already run together, while the positive elements have still not been correctly polymerized through.

The following measurement quantities were furthermore determined on the test clichés: cliché hardness, anisotropy factor and ozone crack resistance.

EXAMPLE 1

For the preparation of the photosensitive mixture, the components and amounts shown in Table 1 were employed and converted in accordance with the above general procedure into a photopolymerizable flexographic printing plate.

TABLE 1

| Component | Grade | Amount |
|---|---|---|
| SIS block copolymer | Kraton D-1161, SIS block copolymer, 15% by weight of polystyrene | 34.247% |
| SBS block copolymer | Kraton D-KX222, SBS block copolymer, 18% by weight of polystyrene | 34.247% |
| Plasticizer | Polyoil 130 (polybutadiene oil) | 20% |
| Monomer | 1,6-hexanediol diacrylate | 5% |
|  | 1,6-hexanediol dimethacrylate | 3% |
| Photoinitiator | Benzil dimethyl ketal | 2.5% |
| Thermal stabilizer | Kerobit TBK | 1.0% |
| Dye | Neozaponrot 335 | 0.006% |
| Total |  | 100% |
|  | SBS/SIS ratio | 50/50 |

A crystal-clear photopolymerizable flexographic printing element was obtained which could be converted extremely well into a flexographic printing cliché.

The measurement values are shown in Table 3.

EXAMPLE 2

The procedure was as in Example 1, but the plasticizer used was a medicinal white oil instead of polyoil 130.

The measurement values are shown in Table 3.

Comparative Example 1

The procedure was as in Example 1, but Kraton D-KX222 was replaced by Kraton D-KX225 (linear SBS block copolymer, 30% by weight of polystyrene).

The photopolymerizable flexographic printing element obtained was not totally clear and had a negative exposure latitude.

The measurement values are summarized in Table 3

Comparative Example 2

The procedure was as in Example 1, but Kraton D-KX222 was replaced by Kraton D-KX225 (linear SBS block copolymer, 30% by weight of polystyrene), and polyoil 130 was replaced as plasticizer by a medicinal white oil.

The photopolymerizable flexographic printing element had streaks. The cliché obtained was hazy, and the printing elements were so poorly formed that evaluation was impossible.

Comparative Example 3

The procedure was as in Example 1, but the binder used was exclusively Kraton D-KX222 (SBS block copolymer).

A relatively hard cliché with high anisotropy which broke on flexing of the plate was obtained.

Comparative Example 4

The procedure was as in Example 1, but the SBS/SIS rubber mixing ratio was 80/20.

Although the anisotropy was significantly reduced compared with Comparative Example 3, it was still present. The plate still broke, albeit at a significantly reduced crack formation rate.

EXAMPLE 3

The procedure was as in Example 1, but the SBS/SIS rubber mixing ratio was 70/30.

The plate no longer had any anisotropy and was flexible without breaking.

EXAMPLE 4

The procedure was as in Example 1, but the SBS/SIS rubber mixing ratio was 10/90.

Comparative Example 5

The procedure was as in Example 1, but the binder employed was exclusively SIS rubber.

The plate obtained had significant tack and exhibited ozone cracks after extended use in printing.

|  | Example 1 | Example 2 | Comparative Example 1 | Comparative Example 2 | Comparative Example 3 | Comparative Example 4 | Example 3 | Example 4 | Comparative Example 5 |
|---|---|---|---|---|---|---|---|---|---|
| SBS, polystyrene content | 18% by weight | 18% by weight | 30% by weight | 30% by weight | 18% by weight | 18% by weight | 18% by weight | 18% by weight |  |
| SBS/SIS ratio | 50/50 | 50/50 | 50/50 | 50/50 | 100/0 | 80/20 | 70/30 | 10/90 | 0/100 |
| Raw layer plasticity | 13.3% | 13.3% | 12.5% | 12.5% | 9.5% | 10.2% | 11.6% | 16.3% | 17.3% |
| Cliché hardness (Shore A) | 50 | 51 | 56.4 | 56.4 | 60.5 | 53 | 52 | 42.5 | 41 |
| Behavior on flexing | flexible | flexible | flexible | flexible | fractures | fractures | flexible | flexible | flexible |
| Anisotropy factor | 1 | 1 | 1.4 | 1.4 | 1.875 | 1.25 | 1 | 1 | 1 |
| LEL [min] | 14 | 4 | 18 | — | 12 | 12 | 12 | 12 | 12 |
| UEL [min] | >18 | 8 | 10 | — | >18 | >18 | 18 | 18 | 18 |
| Exposure latitude [min] | >4 | 4 | −8 | — | >6 | >6 | >6 | >6 | >6 |
| Notes | Polybutadiene oil as plasticizer | White oil as plasticizer | Plate not completely clear, EL negative! | Crude plate exhibits streaks, hazy cliché, poorly formed elements | Very hard plates |  |  |  | Ozone cracks on extended use, tacky plate |

I claim:

1. A photopolymerizable composition at least comprising at least one thermoplastic-elastomeric SIS block copolymer having an apparent molecular weight of 80,000 to 300,000 as binder, at least one ethylenically unsaturated monomer, at least one plasticizer, and at least one photoinitiator or photoinitiator system, wherein the mixture furthermore comprises at least one thermoplastic-elastomeric SBS block copolymer having a styrene content of from 5 to 25% by weight, and the SBS block copolymer/SIS block copolymer weight ratio is from 70/30 to 10/90.

2. A photopolymerizable composition as claimed in claim 1, wherein the vinyl bond content of the SBS block copolymer is from 50 to 60%.

3. A photopolymerizable composition as claimed in claim 1, wherein the SBS block copolymer/SIS block copolymer weight ratio is from 60/40 to 40/60.

4. A photopolymerizable composition as claimed in claim 1, wherein the plasticizer is a polybutadiene oil.

5. A photopolymerizable flexographic printing element at least comprising a dimensionally stable layer support and a photopolymerizable layer applied thereto, wherein the photopolymerizable layer comprises a photopolymerizable composition as claimed in claim 1.

6. A photopolymerizable composition at least comprising at least one thermoplastic-elastomeric SIS block copolymer as binder, at least one ethylenically unsaturated monomer, at least one plasticizer, and at least one photoinitiator or photoinitiator system, wherein the mixture furthermore comprises at least one thermoplastic-elastomeric SBS block copolymer having a styrene content of from 5 to 25% by weight, and the SBS block copolymer/SIS block copolymer weight ratio is from 70/30 to 10/90, and wherein the SIS block copolymer has a linear and the SBS block copolymer a radial structure.

7. The composition of claim 1 wherein the apparent molecular weight of the SBS block copolymer is from 200,000 to 250,000.

* * * * *